US012760406B2

(12) United States Patent
Nomura et al.

(10) Patent No.: US 12,760,406 B2
(45) Date of Patent: Oct. 13, 2026

(54) METHOD FOR PRODUCING SPECTACLE LENS

(71) Applicant: HOYA LENS THAILAND LTD., Pathumthani (TH)

(72) Inventors: Takumi Nomura, Tokyo (JP); Kyosuke Ueda, Tokyo (JP)

(73) Assignee: HOYA LENS THAILAND LTD., Pathumthani (TH)

( * ) Notice: Subject to any disclaimer, the term of this patent is extended or adjusted under 35 U.S.C. 154(b) by 0 days.

(21) Appl. No.: 18/035,383

(22) PCT Filed: Nov. 9, 2021

(86) PCT No.: PCT/JP2021/041074
§ 371 (c)(1),
(2) Date: May 4, 2023

(87) PCT Pub. No.: WO2022/097752
PCT Pub. Date: May 12, 2022

(65) Prior Publication Data

US 2023/0407456 A1 Dec. 21, 2023

(30) Foreign Application Priority Data

Nov. 9, 2020 (JP) ................................ 2020-186826
May 19, 2021 (JP) ................................ 2021-084592

(51) Int. Cl.
*C23C 14/20* (2006.01)
*C23C 14/08* (2006.01)
(Continued)

(52) U.S. Cl.
CPC ............ *C23C 14/20* (2013.01); *C23C 14/083* (2013.01); *C23C 14/10* (2013.01); *C23C 14/12* (2013.01); *C23C 14/30* (2013.01)

(58) Field of Classification Search
CPC .............................. C23C 14/30; C23C 14/243
See application file for complete search history.

(56) References Cited

U.S. PATENT DOCUMENTS 4,552,855 A * 11/1985 Ozin ...................... B01J 29/061 556/136
5,534,314 A * 7/1996 Wadley .................. C23C 14/30 118/727
(Continued)

FOREIGN PATENT DOCUMENTS

CN 105861993 A 8/2016
JP S59132940 A 7/1984
(Continued)

OTHER PUBLICATIONS

Retention and Transport of Silver Nanoparticles in a Ceramic Porous Medium Used for Point-of-Use Water Treatment Dianjun Ren and James A. Smith Environmental Science & Technology 2013 47 (8), 3825-3832 (Year: 2013).*
(Continued)

*Primary Examiner* — Alex A Rolland
(74) *Attorney, Agent, or Firm* — Sughrue Mion, PLLC

(57) ABSTRACT

Provided is a method for producing a spectacle lens including a metal-containing layer, comprising: irradiating, with an electron beam by electron-beam vapor deposition, a vapor deposition source having metal particles supported on a carrier to form the metal-containing layer.

8 Claims, 1 Drawing Sheet

(51) Int. Cl.

| | |
|---|---|
| ***C23C 14/10*** | (2006.01) |
| ***C23C 14/12*** | (2006.01) |
| ***C23C 14/30*** | (2006.01) |

(56) References Cited

U.S. PATENT DOCUMENTS

| | | | | |
|---|---|---|---|---|
| 6,881,445 | B1 * | 4/2005 | Arora | B05D 1/60 427/255.6 |
| 2003/0181044 | A1 | 9/2003 | Takahashi et al. | |
| 2007/0166522 | A1 * | 7/2007 | Beinat | G02B 1/116 428/212 |
| 2010/0285206 | A1 * | 11/2010 | Woelk | C23C 16/4482 118/667 |
| 2012/0019913 | A1 | 1/2012 | Nishimoto et al. | |
| 2018/0319728 | A1 | 11/2018 | Shan et al. | |
| 2021/0325693 | A1 | 10/2021 | Nomura | |

FOREIGN PATENT DOCUMENTS

| | | | |
|---|---|---|---|
| JP | H03126865 | A | 5/1991 |
| JP | H09327622 | A | 12/1997 |
| JP | 2001140061 | A | 5/2001 |
| JP | 2001207260 | A | 7/2001 |
| JP | 2002205353 | A | 7/2002 |
| JP | 2004258278 | A | 9/2004 |
| JP | 2008107836 | A | 5/2008 |
| JP | 2009046372 | A | 3/2009 |
| JP | 3152817 | U | 7/2009 |
| JP | 2012-171175 | A | 9/2012 |
| JP | 2018012877 | A * | 1/2018 |
| JP | 2018144004 | A | 9/2018 |
| JP | 2020106751 | A | 7/2020 |
| JP | 2020142494 | A | 9/2020 |
| KR | 2003-0071054 | A | 9/2003 |
| WO | 2020138469 | A1 | 7/2020 |

OTHER PUBLICATIONS

Machine Translation of JP 2018012877A, no date.*

JP2021-084592, "Decision of Refusal" with Machine Translation, Jul. 19, 2022, 5 pages.

JP2021-084592, "Notice of Reasons for Refusal" with Machine Translation, Sep. 28, 2021, 10 pages.

JP2021-084592, "Notice of Reasons for Refusal" with Machine Translation, Feb. 22, 2022, 9 pages.

PCT/JP2021/041074, "International Preliminary Report on Patentability" and English translation, May 19, 2023, 11 pages.

PCT/JP2021/041074, "English Translation of International Search Report", Dec. 28, 2021, 3 pages.

EP21889303.0, "Extended European Search Report", Sep. 4, 2024, 7 pages.

Communication issued Mar. 8, 2025 in Chinese Patent Application No. 202180075414.9.

Office Action issued Sep. 3, 2025 in Chinese Patent Application No. 202180075414.9.

Office Action issued Dec. 22, 2025 in Chinese Application No. 202180075414.9.

* cited by examiner

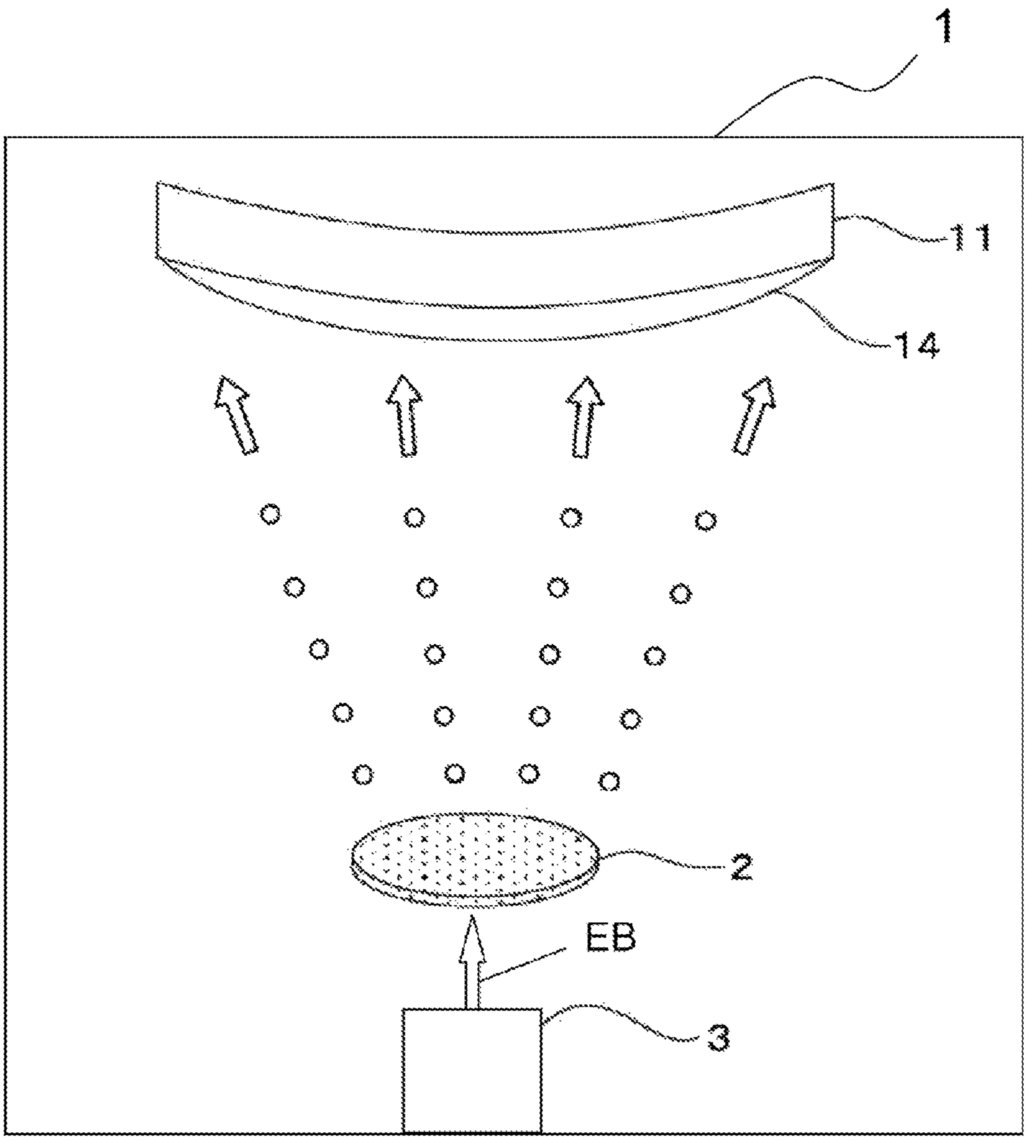
1
11
14
2
EB
3

METHOD FOR PRODUCING SPECTACLE LENS

CROSS-REFERENCE TO RELATED APPLICATIONS

The present application is the National Stage of International Application No. PCT/JP2021/041074, filed Nov. 9, 2021, which claims priority to Japanese Patent Application No. 2021-084592, filed May 19, 2021, and Japanese Patent Application No. 2020-186826, filed Nov. 9, 2020, and the contents of which are incorporated by reference.

TECHNICAL FIELD

The present disclosure relates to a method for producing a spectacle lens.

BACKGROUND ART

Spectacle lenses are each generally structured to have one or more functional layers on a surface of a lens substrate (see, for example, Patent Literature 1).

CITATION LIST

Patent Literature

Patent Literature 1: JP H09-327622 A

SUMMARY OF DISCLOSURE

Technical Problem

JP H09-327622 A (Patent Literature 1) discloses that a surface cured film formed as a functional layer by curing an antimicrobial coating agent is formed on a synthetic resin molding. Providing the functional layer in this manner can contribute to increasing the added value of spectacle lens.

However, JP H09-327622 A (Patent Literature 1) states that the thickness of the surface cured film is preferably 0.5 μm or more (see paragraph 0019 of the same publication). A layer with such a thick film may significantly affect the reflection characteristics and/or transmission characteristics of the spectacle lens. Accordingly, when such a layer is provided on a spectacle lens so as to impart functionality, it is considered that the optical design of existing products should usually be changed significantly. Therefore, it is desirable to be able to produce a spectacle lens having a functional layer without changing or significantly changing the optical design of existing products.

In view of such circumstances, the purpose of one aspect of the present disclosure is to provide a novel method for producing a spectacle lens having a functional layer.

Solution to Problem

One aspect of the present disclosure relates to a method (hereinafter, also simply referred to as the "production method") for producing a spectacle lens including a metal-containing layer, comprising:

irradiating, with an electron-beam (EB) by electron-beam vapor deposition, a vapor deposition source having metal particles supported on a carrier to form the metal-containing layer.

In the above production method, the metal-containing layer may be formed into a thin film by electron-beam vapor deposition including irradiating, with an electron beam, a vapor deposition source having metal particles supported on a carrier. This makes it possible to produce each spectacle lens that can exploit a function(s) provided by the metal-containing layer without changing or significantly changing the optical design of existing products.

Advantageous Effects of Disclosure

An aspect of the present disclosure can provide a novel method for producing a spectacle lens having a functional layer.

BRIEF DESCRIPTION OF DRAWINGS

FIG. 1 is a schematic view illustrating an example of a vacuum vapor deposition apparatus including an electron gun.

DESCRIPTION OF EMBODIMENTS

Hereinafter, the method for producing a spectacle lens will be described in more detail.

<Metal-Containing Layer>

The above production method may be used to produce a spectacle lens having a metal-containing layer. The function that can be exerted by the metal-containing layer may be controlled by the types and/or combination of metals contained in the metal-containing layer. For example, a metal-containing layer may be formed that can function as an antimicrobial layer contributing to imparting a function capable of suppressing proliferation of microbes (i.e., antimicrobial performance) to the spectacle lens. In this case, as a metal contained in the metal-containing layer, silver can be exemplified as an embodiment. In one embodiment, examples of the metal(s) contained in the metal-containing layer include silver and one or more metals selected from the group consisting of platinum (Pt), gold (Au), palladium (Pd), mercury (Hg), cadmium (Cd), cobalt (Co), nickel (Ni), copper (Cu), zinc (Zn), and titanium (Ti). That is, in one embodiment, the metal-containing layer may contain silver as the first metal, and may contain, as the second metal, one or more metals other than silver. The second metal is one or more metals selected from the group consisting of platinum, gold, palladium, mercury, cadmium, cobalt, nickel, copper, zinc, and titanium. The second metal is preferably one or more metals selected from the group consisting of platinum, palladium, and gold, and more preferably platinum. The metal-containing layer may contain only one kind of metal selected from the above group as the second metal in one embodiment, and may contain two or more kinds of metals in another embodiment.

Examples of the presence form of the metal(s) in the metal-containing layer include a form of a single metal or an meatal alloy, a form of an inorganic compound or an organic compound, and a form of a metal ion. In the metal-containing layer, for example, silver may exist in a plurality of forms. The same point applies to other metals. The present inventors consider that at least part of silver can be ionized by oxidation to exert antimicrobial performance, and this contributes to the fact that the metal-containing layer containing silver can function as an antimicrobial layer. In addition, the present inventors speculate that the sustainability of antimicrobial performance can be increased by selecting, as the second metal, a metal having the effect of controlling the progress of oxidation of silver in the metal-containing layer containing one or more second metals selected from the above group together with silver. However, the present disclosure is not limited to the speculation described herein.

In one embodiment, the metal-containing layer may be a metal-containing inorganic layer. In the present disclosure and the present specification, the "inorganic layer" is a layer containing an inorganic substance, and preferably a layer containing an inorganic substance as a principal component. Here, the principal component contributes to the largest part in a layer and usually contributes to approximately 50 to 100 mass % or even approximately 90 to 100 mass % based on the mass of the layer. The same applies to the principal components described below. The metal-containing inorganic layer may contain the metal in the form of an inorganic substance such as a single metal, an alloy, or an inorganic compound. The inorganic substance has high thermal stability and tends to be hardly thermally decomposed. In this respect, the inorganic substance is preferably a component constituting a layer provided in a spectacle lens for which treatment involving heating is often performed during a production process.

<Electron-Beam Vapor Deposition>

In the above production method, the metal-containing layer may be formed by electron-beam vapor deposition including irradiating, with an electron beam, a vapor deposition source having metal particles supported on a carrier. By adopting such a film deposition process, a thin metal-containing layer can be easily formed. In addition, it is preferable that the thin film layer can be formed with good uniformity of the film thickness from the viewpoint of improving a function exhibited by the layer or maintaining the function. Also from this point of view, it is preferable to adopt the above film deposition process to form the metal-containing layer.

The electron-beam vapor deposition method is a film formation method in which a vapor deposition source is irradiated with an electron beam from an electron gun in vacuum, a vapor deposition material included in the vapor deposition source is heated and vaporized, and the vapor deposition material is deposited on a deposition target to form a vapor deposition film. On the other hand, examples of the vapor deposition method also include a method of heating a vapor deposition material by heating the internal atmosphere of a vapor deposition apparatus by using a heating unit (e.g., a heater) disposed in the apparatus to vaporize the vapor deposition material (hereinafter, referred to as a "heating vapor deposition method"). In the heating vapor deposition method, a deposition target disposed in the vapor deposition apparatus is also heated. Meanwhile, a lens substrate of spectacle lens is preferably a plastic lens substrate as described later, but the plastic lens substrate may be deformed when exposed to a high temperature. Thus, when a film is formed on a plastic lens substrate by adopting a heating vapor deposition method, it is preferable to set the heating temperature in consideration of suppressing deformation of the plastic lens substrate. On the other hand, the heating temperature thus set is not necessarily a heating temperature suitable for the vapor deposition material. Therefore, it is not necessarily easy in some cases to form a thin vapor deposition film having excellent film thickness uniformity. Alternatively, a vapor deposition material that can be vaporized at a preset heating temperature should be selected. As a result, the type of applicable vapor deposition material may be limited. On the other hand, in the electron-beam vapor deposition method, a vapor deposition material is heated by irradiating a vapor deposition source with an electron beam. Therefore, the vapor deposition film can be formed without exposing a deposition target to a high temperature as in the case of using the above-described heating vapor deposition method.

Hereinafter, specific embodiments of a method of forming the metal-containing layer by an electron-beam vapor deposition method will be described. However, the present disclosure is not limited to the following embodiments.

The vapor deposition source used is a vapor deposition source having metal particles supported on a carrier. For example, the metal(s) contained in the metal-containing layer is a combination of the first metal (i.e., silver) and one or more second metals as described above. In this case, such a vapor deposition source may be prepared, for example, by the following procedure.

A solution containing particles of silver as the first metal (silver particles) (hereinafter, also referred to as a "first metal-containing solution") is prepared. Such a solution can be, for example, an aqueous solution, and can be an aqueous dispersion of silver particles. The concentration of the silver particles in the first metal-containing solution may be, for example, in the range of 1000 to 10000 ppm. In the present disclosure and the present specification, ppm is on a mass basis.

In addition to the above solution, a solution containing particles of one or more kinds of the second metal(s) (hereinafter, also referred to as a "second metal-containing solution") is prepared. Such a solution can be, for example, an aqueous solution, and can be an aqueous dispersion of second metal particles. Meanwhile, the second metal-containing solution used may be only one type of solution containing one or more kinds of the second metal particles. Alternatively, two or more kinds of solutions containing one or more kinds of the second metal particles may also be used. In either case, the concentration of the second metal particles in the second metal-containing solution may be, for example, in the range of 1000 to 10000 ppm. Here, the second metal-containing solution may contain two or more kinds of the second metal particles. In this case, the above concentration refers to the total concentration of the two or more kinds of metal particles.

Each solution used as described above may be, for example, a commercially available product, as it is, as an aqueous dispersion of metal particles. Alternatively, a commercially available product may be diluted and then used.

After the solution is thus prepared, a carrier is impregnated with the solution. In the case of multiple kinds of solutions as described above, the carrier may be impregnated with the solutions separately, or may be impregnated with the solutions simultaneously. Alternatively, the carrier may be impregnated with a mixed solution obtained by mixing the multiple kinds of solutions. The volume of the first metal-containing solution to be impregnated into the carrier may be, for example, in the range of 0.1 to 5.0 ml. The volume of the second metal-containing solution to be impregnated into the carrier may be, for example, in the range of 0.1 to 5.0 ml. In addition, the volume of the second metal-containing solution may be 0.1 to 5 times the volume of the first metal-containing solution. Here, two or more kinds of solutions may be used as the second metal-containing solution. In this case, the above volume refers to the total volume of the two or more kinds of solutions.

Examples of the method of impregnating a carrier with a solution include a method of injecting or spraying a solution into a carrier or a method of soaking a carrier in a solution.

Meanwhile, the carrier may be, for example, a porous body, and may be made of, for example, a metal, an alloy, or a ceramic. Specific examples of the porous body include a sintered filter. The sintered filter may be a sintered body obtained by sintering a powder material such as metal powder, alloy powder, or ceramic powder.

Drying treatment using a known procedure after impregnating a carrier with the above-described solution may be conducted to produce a carrier carrying the first metal particles and the second metal particles.

The particle size of each metal particle described above is preferably 1 nm or larger and 10 nm or less, and more preferably 1 nm or larger and 5 nm or less from the viewpoint of easy vaporization by electron beam irradiation.

The electron-beam vapor deposition may be performed in a vacuum vapor deposition apparatus including an electron gun. FIG. 1 shows a schematic view of an example of the vacuum vapor deposition apparatus.

In a vacuum vapor deposition apparatus 1 illustrated in FIG. 1 (commonly called a "vacuum chamber"), a deposition target 11 faces, via a vapor deposition source 2, an electron gun 3. The surface of the deposition target 11 on the vapor deposition source side is a surface of a portion on which a metal-containing layer 14 is to be deposited. Such a surface is a surface of a lens substrate when the metal-containing layer is directly provided on the surface of a lens substrate. When the metal-containing layer is layered on a layer provided on the lens substrate, a surface of the provided layer is used. The electron beam can be generated by applying a heating current to a filament provided in the electron gun 3. The heating current may be set according to, for example, the configuration of the electron gun used and the type of the deposition material. Further, irradiation conditions such as electron beam irradiation time may be set according to, for example, a desired film thickness. When the vapor deposition source 2 is irradiated with an electron beam EB emitted from the electron gun, the vapor deposition material included in the vapor deposition source is heated and vaporized. As a result, the vapor deposition material is deposed on a surface of the deposition target 11 to form the metal-containing layer 14. The vapor deposition source used may be a vapor deposition source in which the first metal particles and the second metal particles are supported on a carrier as described above. In this case, the first metal particles and the second metal particles, which are vapor deposition materials, are heated and vaporized by electron beam irradiation. As a result, the metal-containing layer 14, as a vapor deposition film containing these metals, can be formed on the deposition target 11. The inside of the vacuum chamber is, for example, an air atmosphere. The internal pressure may be usually a pressure at which vacuum vapor deposition is performed, and may be, for example, $2\times10^{-2}$ Pa or less. The number of times of performing the electron-beam vapor deposition process is one or more, and the electron beam vapor deposition process may be performed twice or more using the same kind or different kinds of vapor deposition sources. For example, the electron-beam vapor deposition process may be performed twice or more using the same kind or different kinds of vapor deposition sources to form a metal-containing layer having a larger film thickness.

The above description illustrates the case of forming a metal-containing layer containing two or more kinds of metals. In one embodiment, however, the metal-containing layer may contain only one kind of metal included. The above description can also be referred to for the formation of such a metal-containing layer.

As described above, it is possible to produce a spectacle lens having a functional layer without changing or significantly changing the optical design of existing products. From this viewpoint, it is preferable that the presence of the functional layer hardly affects the reflection characteristics and/or transmission characteristics of the spectacle lens. From this point of view, the film thickness of the metal-containing layer is preferably thin, and the film thickness of the metal-containing layer is preferably 5 nm or less, more preferably 4 nm or less, and still more preferably 3 nm or less (e.g., 1 nm or more and 3 nm or less). In the present disclosure and the present specification, the film thickness of the metal-containing layer is a physical film thickness. The same point applies to various thicknesses in the present disclosure and the present specification. The film thickness of the metal-containing layer refers to the total thickness of two or more layers for a spectacle lens in which the two or more layers of the same type or different types of metal-containing layers are layered by two or more film deposition processes. As described above, it is preferable to form the metal-containing layer by the electron-beam vapor deposition method in order to form a thin vapor deposition film having a film thickness in the above range and excellent film thickness uniformity. The film thickness of each layer included in a spectacle lens, such as the metal-containing layer, and the thickness of a lens substrate may be determined by, for example, observing a cross-section while using a scanning electron microscope (SEM).

The metal-containing layer described above may be provided directly on a surface of a lens substrate for a spectacle lens in one embodiment. In another embodiment, the metal-containing layer may be indirectly provided, via one or more other layers, on a surface of a lens substrate. The following describes a lens substrate and each layer that can be included in a spectacle lens produced by the above production method.

<Lens Substrate>

The lens substrate for the spectacle lens may be a plastic lens substrate or a glass lens substrate. The glass lens substrate may be, for example, a lens substrate made of inorganic glass. As the lens substrate, a plastic lens substrate is preferable from the viewpoint of being light, hardly broken, and easy to handle. Examples of the plastic lens substrate include a styrene resin including a (meth)acrylic resin, a polycarbonate resin, an allyl resin, an allyl carbonate resin such as diethyleneglycol bis(allylcarbonate) resin (CR-39), a vinyl resin, a polyester resin, a polyether resin, a urethane resin obtained through reaction between an isocyanate compound and a hydroxy compound such as diethylene glycol, a thiourethane resin obtained through reaction between an isocyanate compound and a polythiol compound, and a cured product (generally referred to as a transparent resin) obtained by curing a curable composition containing a (thio)epoxy compound having one or more intermolecular disulfide bonds. The lens substrate may be undyed (a colorless lens) or dyed (a dyed lens). The refractive index of the lens substrate can be, for example, approximately 1.60 to 1.75. Provided that the refractive index of the lens substrate is not limited to the above range, but may be within the above range or deviate therefrom. In the present disclosure and the present specification, the refractive index refers to a refractive index with respect to light having a wavelength of 500 nm. In addition, the lens substrate may be a lens having power (so-called prescription lens) or a lens having no power (so-called plain glass lens).

The spectacle lens can be various lenses such as a monofocal lens, a multifocal lens, and a progressive addition lens. The type of the lens is determined depending on the shapes of both surfaces of the lens substrate. Further, the surface of the lens substrate may be a convex surface, a concave surface, or a flat surface. In a common lens substrate and spectacle lens, the object-side surface is a convex surface, and the eyeball-side surface is a concave surface. However, the present disclosure is not limited to the above.

<Layer that can be Included in Spectacle Lens>

(Inorganic Layer)

The spectacle lens may have an inorganic layer on a lens substrate. In the present disclosure and the present specification, the "inorganic layer" is a layer containing an inorganic substance, and preferably a layer containing an inorganic substance as a principal component as described above. The principal component is as described previously. The inorganic layer may be a layer directly layered on a surface of the lens substrate, or a layer indirectly layered, via one or more other layers, on a surface of the lens substrate. Examples of the other layer include one or more known layers such as what is generally called a hard coat layer, namely a cured layer made of a curable composition or a primer layer provided for improving adhesion. The type and film thickness of each layer above are not particularly limited, and may be determined according to the function and optical characteristics desired for a spectacle lens.

In one embodiment, the inorganic layer may be a multilayer film containing two or more inorganic layers. When the inorganic layer is a multilayer film, the metal-containing layer may be provided on the uppermost inorganic layer of the multilayer film (i.e., the inorganic layer at the position farthest from the lens substrate). Examples of such a multilayer film include a multilayer film including one or more high refractive index layers and one or more low refractive index layers. Such a multilayer film may be an antireflection film having a property of preventing reflection of light with a specific wavelength or light in a specific wavelength range, or a reflection film having a property of reflecting light with a specific wavelength or light in a specific wavelength range. In the present disclosure and the present specification, "high" and "low" regarding "high refractive index" and "low refractive index" are relative notations. That is, the high refractive index layer refers to a layer having a refractive index higher than that of the low refractive index layer included in the same multilayer film. In other words, the low refractive index layer refers to a layer having a refractive index lower than that of the high refractive index layer included in the same multilayer film. The refractive index of the high refractive index material constituting the high refractive index layer may be, for example, 1.60 or higher (e.g., in a range of 1.60 to 2.40). The refractive index of the low refractive index material constituting the low refractive index layer may be, for example, 1.59 or less (e.g., in a range of 1.37 to 1.59). Provided that, as described above, the notations "high" and "low" relating to the high refractive index and the low refractive index are relative. Therefore, the refractive indexes of the high refractive index material and the low refractive index material are not limited to the above ranges.

Specifically, a high refractive index material for forming the high refractive index layer can be a mixture of one or more oxides selected from the group consisting of zirconium oxide (for example, $ZrO_2$), tantalum oxide ($Ta_2O_5$), titanium oxide (for example, $TiO_2$), aluminum oxide ($Al_2O_3$), yttrium oxide (for example, $Y_2O_3$), hafnium oxide (for example, $HfO_2$), and niobium oxide (for example, $Nb_2O_5$). Meanwhile, examples of a low refractive index material for forming the low refractive index layer include one type of oxide or fluoride selected from the group consisting of silicon oxide (for example, $SiO_2$), magnesium fluoride (for example, $MgF_2$), and barium fluoride (for example, $BaF_2$), and a mixture of two or more types of oxides and fluorides selected therefrom. In the above examples, oxide and fluoride are expressed in a stoichiometric composition for convenience, but oxide or fluoride in which oxygen or fluorine is deficient or excessive as compared to the stoichiometric composition can also be used as the high refractive index material or the low refractive index material.

Preferably, the high refractive index layer is a film containing a high refractive index material as a principal component, and the low refractive index layer is a film containing a low refractive index material as a principal component. A film formation material (e.g., a vapor deposition material) including the above high refractive index material or low refractive index material as a principal component may be used for film formation. As a result, such a film (for example, a deposited film) can be formed. The film and the film deposition material may contain impurities that are inevitably mixed, and may include another component such as another inorganic substance or a known additive component which supports film formation as long as the component does not impair the function of the principal component. The film formation can be performed by a known film formation method, and is preferably performed by vapor deposition from a viewpoint of ease of the film formation. It is more preferable to perform vacuum vapor deposition. The antireflection film may be, for example, a multilayer film in which a total of 3 to 10 layers of high refractive index layers and low refractive index layers are alternately layered. The film thickness of each high refractive index layer and the film thickness of each low refractive index layer may be determined according to the layer structure. Specifically, the combination of layers included in the multilayer film and the film thickness of each layer may be determined by an optical design simulation using a known technique on the basis of the refractive index of the film deposition material for forming the high refractive index layer and the low refractive index layer, and desired reflection characteristics and transmission characteristics to be imparted to the spectacle lens by providing the multilayer film. In addition, the multilayer film may include, at a given position(s), one or more layers containing a conductive oxide as a principal component (conductive oxide layer), preferably one or more conductive oxide-containing vapor deposition films formed by vapor deposition using a vapor deposition material containing a conductive oxide as a principal component.

In one embodiment, the spectacle lens produced by the above production method may have the metal-containing layer on a surface of the inorganic layer. For example, the metal-containing layer may be a layer directly layered on a surface of the inorganic layer, or a layer indirectly layered, via one or more other layers, on a surface of the inorganic layer. The other layers may refer to the above description.

(Water-Repellent Layer)

The spectacle lens produced by the above production method may have a water-repellent layer. In the present disclosure and the present specification, the "water-repellent layer" refers to a layer that contributes to the surface of the spectacle lens exhibiting water repellency, or contributes to exhibiting more favorable water repellency as compared to a case where this layer is not provided. In one embodiment, the spectacle lens produced by the above production method may have a water-repellent layer on a surface of the metal-containing layer. For example, the water-repellent layer may be a layer directly layered on a surface of the metal-containing layer, or a layer indirectly layered, via one or more other layers, on a surface of the metal-containing layer. The other layers may refer to the above description.

The water-repellent layer may be layered on the metal-containing layer by performing a film formation process using a film deposition material that can function as a water-repellent agent. Examples of the film formation process include a film formation method selected from the group consisting of a dry film formation method and a wet film formation method. Examples of the dry film formation method include physical vapor deposition and chemical vapor deposition, and examples of the wet film formation method include a coating method. Examples of the physical vapor deposition method include a vapor deposition method and a sputtering method. Here, a vapor deposition method is preferable.

In one embodiment, the water-repellent layer may be a fluorine-based organic layer. Here, the term “based” is used to mean “containing”. In addition, in the present disclosure and the present specification, the “organic layer” is a layer containing an organic substance, and preferably a layer containing an organic substance as a principal component. The principal component is as described previously.

The fluorine-based organic layer may be layered on the metal-containing layer by performing a film formation process using a fluorine-based organic substance as a film formation material. Examples of a preferable film formation method for forming the fluorine-based organic layer include a dry film formation method. Here, a vapor deposition method is more preferable. The fluorine-based organic substance tends to have a lower boiling point than the vapor deposition material that can be used for forming the metal-containing layer described above. Thus, it is also preferable to use a heating vapor deposition method. A carrier is impregnated with a solution containing a fluorine-based organic substance, and then subjected to drying treatment. As a result, a vapor deposition source having the fluorine-based organic substance supported on the carrier can be produced. Regarding how to prepare the vapor deposition source, one can consult, if appropriate, the above description for the formation of the metal-containing layer.

Examples of the fluorine-based organic substance include m-xylene hexafluoride ($C_6H_4(CF_3)_2$).

In addition, examples of the fluorine-based organic substance also include the fluorine-based organosilane compound represented by the following general formula (1).

[Chemical Formula 1]

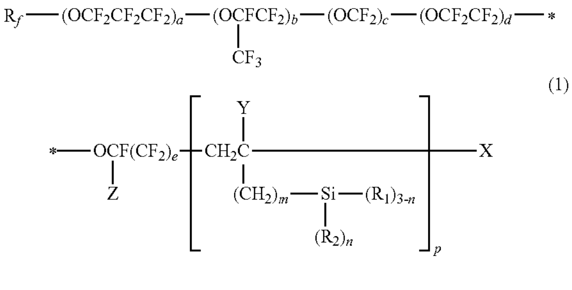

(1)

In the general formula (1), Rf is a $C_{1-16}$ linear or branched perfluoroalkyl group, and is preferably $CF_3$—, $C_2F_5$—, or $C_3F_7$—. $R_1$ is a hydrolyzable group, and is preferably, for example, a halogen atom, —$OR_3$, —$OCOR_3$, —$OC(R_3)$═$C(R_4)_2$, —$ON$═$C(R_3)_2$, or —$ON$═$CR_5$. More preferred is a chlorine atom, —$OCH_3$, or —$OC_2H_5$. Here, $R_3$ is an aliphatic hydrocarbon group or an aromatic hydrocarbon group; $R_4$ is a hydrogen atom or an aliphatic hydrocarbon group (e.g., a lower aliphatic hydrocarbon group); and $R_5$ is a $C_{3-6}$ divalent aliphatic hydrocarbon group. $R_2$ is a hydrogen atom or a monovalent organic group. The monovalent organic group is preferably an inert group. The monovalent organic group is more preferably a $C_{1-4}$ monovalent hydrocarbon group. X is an iodine atom or a hydrogen atom, and Y is a hydrogen atom or an alkyl group (e.g., a lower alkyl group). Z is a fluorine atom or a trifluoromethyl group. Here, a, b, c, and d are each independently an integer in the range of 0 to 200 and preferably an integer in the range of 1 to 50; e is 0 or 1; m and n are each independently an integer in the range of 0 to 2 and preferably 0; and p is an integer of 1 or more and preferably an integer in the range of 1 to 10.

In addition, the molecular weight (weight average molecular weight Mw) of the fluorine-based organosilane compound represented by the general formula (1) is not particularly limited. For example, the range can be $5\times10^2$ to $1\times10^5$ or $5\times10^2$ to $1\times10^4$.

In one embodiment, the fluorine-based organosilane compound represented by the general formula (1) may be a fluorine-based organosilane compound represented by the following general formula (2).

[Chemical formula 2]

(2)

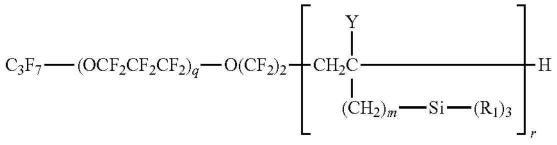

$R_1$, Y, and m in the general formula (2) have the same meaning as in the general formula (1). Here, q is an integer in the range of 1 to 50 and r is an integer in the range of 1 to 10.

The film thickness of the water-repellent layer may be, for example, 30 nm or less, 25 nm or less, 20 nm or less, or 15 nm or less. In addition, the film thickness of the water-repellent layer may be, for example, 5 nm or more or 10 nm or more. Further, the contact angle of the surface of the water-repellent layer with respect to water may be, for example, 100 degrees or more and 120 degrees or less.

In the production method, one or more metal-containing layers may be formed at a given position(s) on either the object side or the eyeball side of the spectacle lens. For example, in the production method, it is possible to produce a spectacle lens having the metal-containing layer between the inorganic layer and the water-repellent layer. In this case, the stack including at least the inorganic layer, the metal-containing layer, and the water-repellent layer may be formed on at least one surface of a lens substrate, and may also be formed on both surfaces. For example, the stack may be located on the object side of the spectacle lens; the stack may be located on the eyeball side of the spectacle lens; and the stack may be located on each of the object side or the eyeball side of the spectacle lens. The stack may be located on both sides of the spectacle lens. In this case, the stack on the object side and the stack on the eyeball side may be the same stack or different stacks.

In the spectacle lens, the metal-containing layer can function as an antimicrobial layer, thereby eliciting antimicrobial performance. In addition, in a case where the spectacle lens has a water-repellent layer, the spectacle lens can also exert water-repellency, whereby, for example, water burn of the lens can be prevented. The inorganic layer functions as, for example, an antireflection film. This can impart, to the spectacle lens, antireflection performance in response to light with a specific wavelength or light in a specific wavelength range.

EXAMPLES

Hereinafter, the present disclosure will be further described based on Examples. However, the present disclosure is not limited to embodiments illustrated in the Examples.

Hereinbelow, the $SiO_2$ layer is a vapor deposited film formed using silicon oxide as a vapor deposition material. The $ZrO_2$ layer is a vapor deposited film formed using zirconium oxide as a vapor deposition material. Each vapor deposition material is a vapor deposition material consisting of the oxide described except for inevitably mixed impurities.

Example 1

<Production of Hard Coat Layer-Attached Lens Substrate>

A hard coat liquid containing inorganic oxide particles and a silicon compound was applied by spin coating onto the entire object-side surface (convex surface) of a plastic lens substrate produced from a spectacle lens-use monomer (trade name "MR8", manufactured by Mitsui Chemicals, Inc.). Next, the material was heated and cured for 60 minutes in a heating furnace at a furnace inside temperature of 100° C. to form a hard coat monolayer with a film thickness of 3 μm.

<Production of Multilayer Antireflection Film>

Subsequently, the lens substrate on which the hard coat layer is formed was placed in a vacuum vapor deposition apparatus. A vacuum vapor deposition process was applied over the entire hard coat layer surface to form a multilayer antireflection film in which a total of seven layers "$SiO_2$ layer/$ZrO_2$ layer/$SiO_2$ layer/$ZrO_2$ layer/$SiO_2$ layer/$ZrO_2$ layer/$SiO_2$ layer" (total thickness: about 400 to 600 nm) were layered. The notation "/" indicates that the portion described on the left and the portion described on the right of "/" are directly layered. The same point applies to the following description.

This process was used to produce a spectacle lens having a layer configuration of "lens substrate/hard coat layer/multilayer antireflection film (inorganic layer; the content of inorganic substance: 90 mass % or more)".

<Production of Metal-Containing Layer>

(Preparation of Vapor Deposition Source)

A first metal-containing solution prepared was an aqueous dispersion containing silver particles having a particle size of 2 to 5 nm at a concentration of 5000 ppm.

A second metal-containing solution prepared was an aqueous dispersion containing platinum particles having a particle size of 2 to 5 nm at a concentration of 5000 ppm.

A carrier used was a disk-shaped sintered filter (material: SUS) having a diameter of 18 mm. After 0.5 ml of the first metal-containing solution was injected into the sintered filter, the sintered filter was subjected to drying treatment in an air oven at an internal temperature of 65 to 75° C. for 1 hour. This process was repeated twice (total amount of the first metal-containing solution injected into the carrier: 1.0 ml). Subsequently, 0.5 ml of the second metal-containing solution was injected and the resulting material was then subjected to drying treatment in an air oven at an internal temperature of 65 to 75° C. for 1 hour. This process was repeated twice (total amount of the second metal-containing solution injected into the carrier: 1.0 ml) to prepare a vapor deposition source in which silver particles and platinum particles (vapor deposition materials) were supported on the sintered filter.

(Deposition of Metal-Containing Layer by Electron-Beam Vapor Deposition Method)

As shown in FIG. 1, a vacuum chamber of a vacuum vapor deposition apparatus included a spectacle lens having the above multilayer antireflection film and the above vapor deposition source. The pressure in the vacuum chamber is set to $2\times10^{-2}$ Pa or less. The electron beam irradiation conditions were set such that the electron beam output (heating current) was 38 mA and the electron beam irradiation time was 150 seconds. Then, an electron beam was emitted from the electron gun toward the vapor deposition source. In this way, the electron beam irradiation can cause the silver particles and the platinum particles to be heated and vaporized. This can result in the formation of a vapor deposited film in which the silver particles and the platinum particles are deposited on a surface of the multilayer antireflection film. This procedure was used to deposit a metal-containing layer (metal-containing inorganic layer containing metals (silver and platinum) and having an inorganic substance content of 90 mass % or more) formed on a surface of the multilayer antireflection film.

<Production of Water-Repellent Layer>

(Preparation of Vapor Deposition Source)

A solution containing m-xylene hexafluoride as a fluorine-based organic substance was provided.

A carrier used was a disk-shaped sintered filter (material: SUS) having a diameter of 18 mm. After 0.25 ml of the above solution was injected into the sintered filter, the sintered filter was subjected to drying treatment in an air oven at an internal temperature of 50° C. for 1 hour.

This procedure was used to prepare a vapor deposition source in which m-xylene hexafluoride (vapor deposition material) was supported on the sintered filter.

(Deposition of Water-Repellent Layer by Heating Vapor Deposition Method)

As shown in FIG. 1, a vacuum chamber of a vacuum vapor deposition apparatus included a spectacle lens having the above metal-containing layer and the vapor deposition source.

The electron gun in FIG. 1 was replaced with a halogen heater, and the halogen heater was used to control, to 650° C., the internal atmosphere temperature of the vacuum chamber. The pressure in the vacuum chamber was set to 2×−2 Pa or less, and a water-repellent layer was then formed by a heating vapor deposition method. In this way, by heating the inside of the chamber, m-xylene hexafluoride can be heated and vaporized. This can result in the formation of a vapor-deposited film in which m-xylene hexafluoride is deposited on a surface of the metal-containing layer. In this way, a water-repellent layer (water repellent agent: m-xylene hexafluoride) having a film thickness of 10 to 20 nm was formed on the surface of the metal-containing layer.

The above steps were used to produce a spectacle lens of Example 1 having a layer configuration of "lens substrate/hard coat layer/multilayer antireflection film (inorganic layer)/metal-containing layer/water-repellent layer (fluorine-based organic layer with an organic substance content of 90 mass % or more)".

Comparative Example 1

The same procedure as in Example 1 was repeated, except that the metal-containing layer was not produced, to produce a spectacle lens of Comparative Example 1 having a layer configuration of "lens substrate/hard coat layer/multilayer antireflection film (inorganic layer)/water-repellent layer".

Example 2

The same procedure as in Example 1 was repeated, except that the metal-containing layer was produced using the following procedure, to produce a spectacle lens of Example 2 having a layer configuration of "lens substrate/hard coat layer/multilayer antireflection film (inorganic layer)/metal-containing layer/water-repellent layer".

<Production of Metal-Containing Layer>

(Preparation of Vapor Deposition Source)

A first metal-containing solution prepared was an aqueous dispersion containing silver particles having a particle size of 2 to 5 nm at a concentration of 5000 ppm.

A second metal-containing solution prepared was an aqueous dispersion containing platinum particles having a particle size of 2 to 5 nm at a concentration of 5000 ppm.

A carrier used was a disk-shaped sintered filter (material: SUS) having a diameter of 18 mm. After 0.5 ml of the first metal-containing solution was injected into the sintered filter, the sintered filter was subjected to drying treatment in an air oven at an internal temperature of 65 to 75° C. for 1 hour. This process was repeated twice (total amount of the first metal-containing solution injected into the carrier: 1.0 ml). Subsequently, 0.5 ml of the second metal-containing solution was injected and the resulting material was then subjected to drying treatment in an air oven at an internal temperature of 65 to 75° C. for 1 hour. This process was repeated twice (total amount of the second metal-containing solution injected into the carrier: 1.0 ml) to prepare a vapor deposition source in which silver particles and platinum particles (vapor deposition materials) were supported on the sintered filter.

In this way, two vapor deposition sources were prepared.

(Deposition of Metal-Containing Layer by Electron-Beam Vapor Deposition Method)

As shown in FIG. 1, a vacuum chamber of a vacuum vapor deposition apparatus included a spectacle lens having the multilayer antireflection film and one of the two vapor deposition sources. The pressure in the vacuum chamber is set to $2\times10^{-2}$ Pa or less. The electron beam irradiation conditions were set such that the electron beam output (heating current) was 38 mA and the electron beam irradiation time was 150 seconds. Then, an electron beam was emitted from the electron gun toward the vapor deposition source. Thus, the first electron-beam vapor deposition process was performed.

The remaining one of the two vapor deposition sources was disposed in a vacuum chamber. The second electron-beam vapor deposition process was performed under the same conditions as for the first electron-beam vapor deposition process.

In this way, the electron beam irradiation can cause the silver particles and the platinum particles to be heated and vaporized. This can result in the formation of a vapor deposited film in which silver particles and platinum particles are deposited on a surface of the multilayer antireflection film.

As described above, the two electron-beam vapor deposition processes were conducted. This procedure was used to deposit a metal-containing layer (metal-containing inorganic layer containing metals (silver and platinum) and having an inorganic substance content of 90 mass % or more) formed on a surface of the multilayer antireflection film.

[Evaluation of Reflection Characteristics and Transmission Characteristics]

Normal incidence reflection spectral characteristics at the optical center of the object-side surface (on the convex surface side) were measured from the object side of each spectacle lens of Example 1 or 2 or Comparative Example 1.

In addition, normal incidence reflection spectral characteristics at the optical center of the eyeball-side surface (on the concave surface side) were measured from the eyeball side of each spectacle lens of Example 1 or 2 or Comparative Example 1.

The spectrum shapes of the transmission spectrum, the reflection spectrum on the convex surface side, and the reflection spectrum on the concave surface side of Example 1 or 2 at a wavelength of 380 to 780 nm as obtained from the measured results were almost the same as the spectrum shapes of each spectrum of Comparative Example 1.

From the measured results, the luminous reflectance was determined according to JIS T 7334:2011, and the luminous transmittance was determined according to JIS T 7333:2005. Table 1 shows the results.

TABLE 1

Luminous reflectance and luminous transmittance of the spectacle lens of Example 1 or 2 or Comparative Example 1

| | Luminous reflectance (convex surface side) | Luminous reflectance (concave surface side) | luminous transmittance |
|---|---|---|---|
| Comparative Example 1 | 0.51% | 0.49% | 98.5% |
| Example 1 | 0.50% | 0.47% | 98.5% |
| Example 2 | 0.47% | 0.45% | 98.4% |

The results shown in Table 1 can indicate that in each spectacle lens of Examples 1 or 2, the metal-containing layer hardly affects the reflection characteristics and transmission characteristics of the spectacle lens.

A cross-section of each spectacle lens of Example 1 or 2 was observed by SEM. It was verified that the metal-containing layer had a film thickness of 3 nm or less (specifically, 1 nm or more and 3 nm or less). The above cross-sectional observation has demonstrated that the metal-containing layer having excellent film thickness uniformity is formed as a continuous layer without any undeposited portion.

[Antimicrobial Performance Test]

Each spectacle lens of Example 1 or 2 or Comparative Example 1 was subjected to an antimicrobial performance test in accordance with JIS Z 2801:2012.

Specifically, three sample pieces are cut out from each spectacle lens for initial evaluation of antimicrobial performance, evaluation of water resistance, and evaluation of light resistance. The size of each sample piece is 50 mm×50 mm.

The initial evaluation is performed by the following protocol.

Put a test piece cut out from each spectacle lens in a sterilized petri dish while placing upward the surface on the side where various layers are layered. Then add dropwise 0.4 ml of a microbial suspension containing $1.0\times10^5$ to $4.0\times10^5$ test bacteria (*Staphylococcus aureus* or *Escherichia coli*) onto the center portion of the surface of the sample, and cover the dish with a polyethylene film cut to a size of 40 mm×40 mm. Place this petri dish under an environment at a relative humidity of 90% or higher for 24 hours, and then measure the viable cell count per $cm^2$.

The water resistance is evaluated using the following procedure.

The test piece cut out from each spectacle lens is subjected to a class 1 water resistance test described in the water resistance test section of the sustainability test method (2018 edition) of SIAA (the Society of International sustaining growth for Antimicrobial Articles). Thereafter, the same protocol as described above is repeated, and the viable cell count is then measured.

The light resistance is evaluated using the following procedure.

The test piece cut out from each spectacle lens is subjected to a class 1 light resistance test described in the water resistance test section of the sustainability test method (2018 edition) of SIAA (the Society of International sustaining growth for Antimicrobial Articles). Thereafter, the same protocol as described above is repeated, and the viable cell count is then measured.

Table 2 shows the viable cell counts measured in the above various evaluations of Comparative Example 1.

TABLE 2

Evaluation results of Comparative Example 1

| Evaluation | | Viable cell count |
|---|---|---|
| *Staphylococcus aureus* | Initial evaluation | $1 \times 10^{3.95}$ |
| | Water resistance evaluation | $1 \times 10^{4.17}$ |
| | Light resistance evaluation | $1 \times 10^{3.99}$ |
| *Escherichia coli* | Initial evaluation | $1 \times 10^{5.95}$ |
| | Water resistance evaluation | $1 \times 10^{6.05}$ |
| | Light resistance evaluation | $1 \times 10^{6.04}$ |

Antimicrobial activity was calculated, using the formula below, from the viable cell counts measured for the above various evaluations in Example 1.

Antimicrobial activity was calculated, using the formula below, from the viable cell counts measured for the above various evaluations in Example 2.

Antimicrobial activity=Ut−At

Ut: logarithmic value of viable cell count in a sample piece of Comparative Example 1

At: logarithmic value of viable cell count in a sample piece of Example 1 or Example 2

SIAA defines that when the antimicrobial activity is 2.0 or higher, the antimicrobial performance is effective.

Table 3 shows the evaluation results of Example 1, and Table 4 shows the evaluation results of Example 2.

TABLE 3

Evaluation results of Example 1

| Evaluation | | Antimicrobial activity |
|---|---|---|
| *Staphylococcus aureus* | Initial evaluation | More than 2.0 |
| | Water resistance evaluation | More than 2.0 |
| | Light resistance evaluation | More than 2.0 |
| *Escherichia coli* | Initial evaluation | More than 2.0 |
| | Water resistance evaluation | More than 2.0 |
| | Light resistance evaluation | More than 2.0 |

TABLE 4

Evaluation results of Example 2

| Evaluation | | Antimicrobial activity |
|---|---|---|
| *Staphylococcus aureus* | Initial evaluation | More than 2.0 |
| | Water resistance evaluation | More than 2.0 |
| | Light resistance evaluation | More than 2.0 |
| *Escherichia coli* | Initial evaluation | More than 2.0 |
| | Water resistance evaluation | More than 2.0 |
| | Light resistance evaluation | More than 2.0 |

Finally, the above-described embodiments will be summarized.

One embodiment provides a method for producing a spectacle lens including a metal-containing layer, comprising:

irradiating, with an electron beam by electron-beam vapor deposition, a vapor deposition source having metal particles supported on a carrier to form the metal-containing layer.

In one embodiment, the metal particles may include silver particles.

In one embodiment, the metal particles may further include one or more kinds of metal particles selected from the group consisting of platinum particles, gold particles, palladium particles, mercury particles, cadmium particles, cobalt particles, nickel particles, copper particles, zinc particles, and titanium particles.

In one embodiment, the production method may further include causing a solution containing the metal particles to be impregnated into the carrier and then performing drying treatment to have the metal particles supported on the carrier.

In one embodiment, the carrier may be a porous body.

In one embodiment, the porous body may be a sintered filter.

In one embodiment, the metal-containing layer may be a metal-containing inorganic layer.

In one embodiment, the metal-containing layer may have a film thickness of 5 nm or less.

Two or more of the various embodiments and forms described herein may be combined in any combination.

Each embodiment disclosed herein is an example in every respect and should not be restrictively understood. The scope of the present disclosure is defined not by the above description but by the Claims, and intends to include all modifications within the spirit and scope equivalent to the Claims.

INDUSTRIAL APPLICABILITY

An embodiment of the present disclosure is useful in the field of producing a spectacle lens and spectacles.

The invention claimed is:

1. A method for producing a spectacle lens including a metal- containing layer, the method comprising:

causing a solution containing metal particles to be impregnated into a carrier and then performing a drying treatment to have the metal particles supported on the carrier, and irradiating, with an electron beam by electron-beam vapor deposition, a vapor deposition source having the metal particles supported on the carrier to form the metal-containing layer, wherein the carrier is a sintered filter made of a metal or an alloy, wherein the spectacle lens comprises, in order, a lens substrate, an inorganic layer, and water-repellant layer, wherein the metal-containing layer is provided between the inorganic layer and the water-repellant layer, and wherein the metal-containing layer has a film thickness of more than 1 nm.

2. The method according to claim 1, wherein the metal particles comprise silver particles.

3. The method according to claim 2, wherein the metal particles further comprise one or more kinds of metal particles selected from the group consisting of platinum particles, gold particles, palladium particles, mercury particles, cadmium particles, cobalt particles, nickel particles, copper particles, zinc particles, and titanium particles.

4. The method according to claim 1, wherein the film thickness is more than 1 nm and 5 nm or less.

5. The method according to claim 1, wherein the metal-containing layer is a metal-containing inorganic layer.

6. The method according to claim 1, wherein the water-repellant layer is a layer directly layered on a surface of the metal-containing layer.

7. The method according to claim 1, wherein the inorganic layer is a multilayer film of two or more inorganic layers.

8. The method according to claim 1, wherein the metal particles comprise silver particles and platinum particles.

* * * * *